(12) United States Patent
Phillips

(10) Patent No.: US 10,121,760 B2
(45) Date of Patent: Nov. 6, 2018

(54) WAFER BONDING SYSTEM AND METHOD

(71) Applicant: Nikon Corporation, Chiyoda-ku, Tokyo (JP)

(72) Inventor: Alton H. Phillips, East Palo Alto, CA (US)

(73) Assignee: Nikon Corporation (JP)

( * ) Notice: Subject to any disclaimer, the term of this patent is extended or adjusted under 35 U.S.C. 154(b) by 801 days.

(21) Appl. No.: 14/519,831

(22) Filed: Oct. 21, 2014

(65) Prior Publication Data

US 2015/0122414 A1 May 7, 2015

Related U.S. Application Data

(60) Provisional application No. 61/899,082, filed on Nov. 1, 2013, provisional application No. 61/899,071, filed on Nov. 1, 2013.

(51) Int. Cl.
*H01L 21/67* (2006.01)
*H01L 23/00* (2006.01)
*B32B 37/10* (2006.01)

(52) U.S. Cl.
CPC .............. *H01L 24/83* (2013.01); *B32B 37/10* (2013.01); *H01L 21/67092* (2013.01); *B32B 2037/1063* (2013.01); *B32B 2457/14* (2013.01); *H01L 2224/8312* (2013.01); *H01L 2224/83203* (2013.01); *H01L 2924/01322* (2013.01); *H01L 2924/15787* (2013.01)

(58) Field of Classification Search
CPC ........... H01L 21/6838; H01L 21/67017; H01L 21/67092; B32B 37/1009

USPC ............................................ 156/583.1, 583.3
See application file for complete search history.

(56) References Cited

U.S. PATENT DOCUMENTS

| | | | |
|---|---|---|---|
| 3,960,623 A * | 6/1976 | Gantley | H01L 21/00 156/212 |
| 3,960,635 A | 6/1976 | LaRoy | |
| 5,273,553 A | 12/1993 | Hoshi | |
| 7,524,920 B2 * | 4/2009 | Pecorini | C08J 5/18 428/1.6 |
| 7,948,034 B2 | 5/2011 | George et al. | |
| 8,147,630 B2 | 4/2012 | George | |
| 8,206,525 B2 | 6/2012 | Izumi | |
| 8,425,715 B2 | 4/2013 | George | |
| 2003/0145943 A1 * | 8/2003 | Lee | B32B 37/0046 156/285 |
| 2003/0178468 A1 * | 9/2003 | Lee | G02F 1/1333 228/102 |
| 2004/0089415 A1 | 5/2004 | Byun | |
| 2005/0186517 A1 * | 8/2005 | Kochersperger | G03F 7/707 430/327 |
| 2008/0124199 A1 * | 5/2008 | Hwang | H01L 21/67092 414/217.1 |
| 2009/0114348 A1 | 5/2009 | Hwang | |

(Continued)

*Primary Examiner* — Scott W Dodds
(74) *Attorney, Agent, or Firm* — Roeder & Broder LLP; Steven G. Roeder

(57) ABSTRACT

A wafer bonding system and method using a combination of heat and a pneumatic force to bond two wafers held together in alignment. The wafers are heated via a non-contact, gaseous interface, thermal path between heating elements and the wafers. The pneumatic force is created by a pressure differential between a first pressure surrounding the two wafers and a second pressure, which is less than the first pressure, maintained between the two wafers.

34 Claims, 5 Drawing Sheets

(56) References Cited

U.S. PATENT DOCUMENTS

| | | |
|---|---|---|
| 2011/0005066 A1 | 1/2011 | Crofoot |
| 2012/0205024 A1 | 8/2012 | Sugaya et al. |
| 2012/0251789 A1 | 10/2012 | Tanaka |
| 2013/0008581 A1 | 1/2013 | Yuki et al. |
| 2013/0155385 A1 | 6/2013 | Hashemi |
| 2015/0122412 A1 | 5/2015 | Phillips et al. |

* cited by examiner

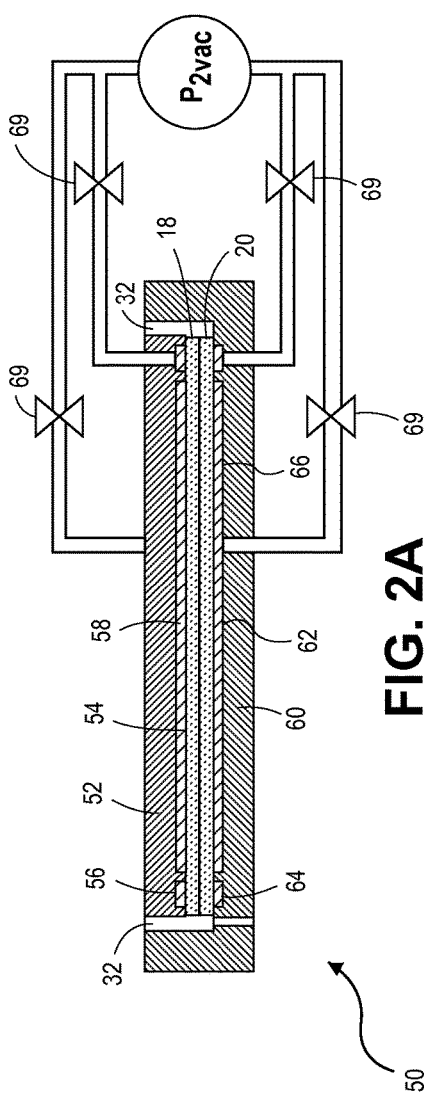
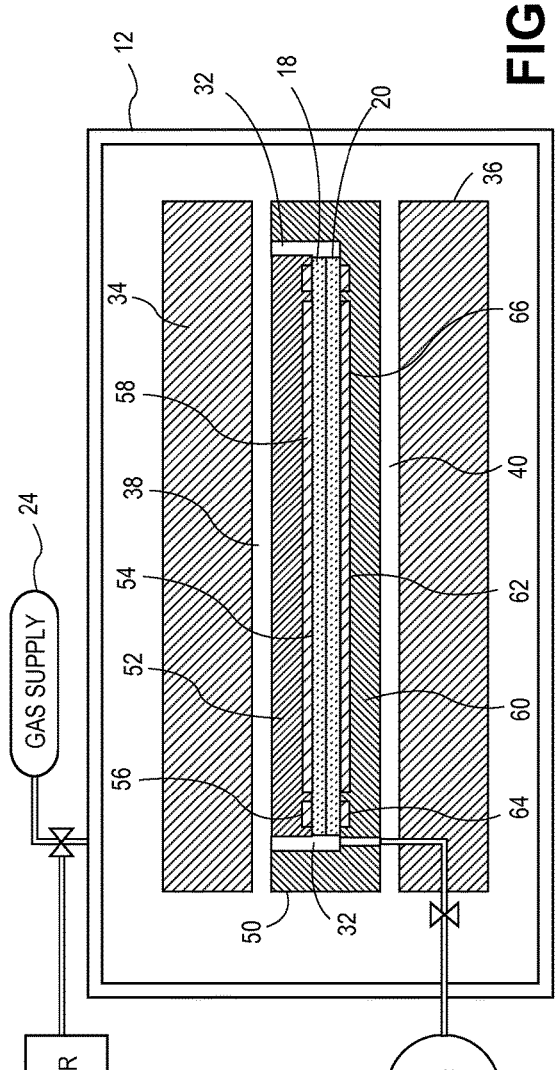

WAFER BONDING SYSTEM AND METHOD

CROSS REFERENCE TO RELATED APPLICATIONS

This application claims the benefit of U.S. Provisional Application Nos. 61/899,071 entitled "Wafer Bonding System and Method," and 61/899,082 entitled "System and Method for Clamping Wafers Together in Alignment Using Pressure," both filed Nov. 1, 2013, and both incorporated by reference herein for all purposes.

BACKGROUND

Field of the Invention

This invention relates to the bonding of aligned semiconductor wafers, and more particularly, to a semiconductor wafer bonder that bonds two, aligned, clamped wafers by applying (i) heat to the two wafers and (ii) a pneumatic force created by a pressure differential between a first pressure surrounding the two wafers and a second pressure, which is less than the first pressure, maintained between the two wafers.

Description of Related Art

Wafer-to-wafer bonding is used in a wide range of semiconductor fabrication applications for forming semiconductor devices. Wafer-to-wafer bonding involves the aligning of two wafer surfaces in contact with one another and then forming a bond interface between the two. The quality of the bond largely depends upon the preservation of the alignment of the two wafers and the uniformity of the heat and/or pressure applied during the bonding process.

Prior to bonding, the opposing surfaces of two wafers to be bonded are placed in contact with one another, aligned, and then held together in alignment by a wafer clamp. The wafer clamp typically includes first and second wafer clamping elements that contact the back surfaces of the two wafers, clamping the wafers together in alignment. During the bonding process, the wafer clamp, including the two wafers, is placed in a vacuum environment, which provides thermal insulation, helps prevent the wafers from oxidizing, and prevents molecular contaminants from collecting on the wafer surfaces. Mechanical elements, such as for example two hydraulic pistons, apply contact pressure directly onto the first and second wafer clamping elements respectively. In addition, heating elements, typically internal to the mechanical elements, apply heat via a direct mechanical thermal path onto to first and second wafer clamping elements respectively. In turn, the first and the second wafer clamping elements apply pressure and heat to the wafers, resulting in bonding between the two wafers.

The above-described wafer bonding devices have a number of problems. First, any shear forces created by the mechanical elements on the wafer clamping elements may cause misalignment of the wafers. Second, the vacuum environment creates a poor and non-determinant thermal coupling between the heating elements and wafers. As a result, non-uniform heat may be applied across the wafer surfaces. The net result of the possible misalignment and non-uniform heat is that a poor bond may be created between the two wafers. In addition, the integration of the heating elements within the mechanical elements means that neither the pressure nor the heating functions can be optimized.

SUMMARY OF THE INVENTION

The above-described problems are solved by a wafer bonding system and method using a combination of heat and a pneumatic force to bond two wafers held together in alignment. The wafers are heated via a non-contact, gaseous interface, thermal path between heating elements and the wafers. The pneumatic force is created by a pressure differential between a first pressure surrounding the two wafers and a second pressure, which is less than the first pressure, maintained between the two wafers.

In a first non-exclusive embodiment, the pneumatic force is generated by placing the wafer clamp, clamping the two wafers in alignment, in a pressure chamber maintained at the first pressure, while creating the second pressure (e.g., a vacuum) between the two wafers. The pressure differential between the first pressure and the second pressure results in the pneumatic force acting on the wafer clamp, which in turn, imparts a bonding force on the wafers. With this embodiment, heating elements are provided adjacent to, but not in mechanical contact with, two wafer clamping surfaces of the wafer clamp respectively. As a result, a non-mechanical, gaseous interface, thermal path is created by ambient gas present in the gaps between the two heating elements and the two wafer clamping surfaces respectively. Heating through the gaseous interface is advantageous because the conductance uniformity along the interface is not significantly influenced by surface flatness, surface roughness, and the surface stresses at the contact surface between the clamp and the heating elements. Therefore, the thermal properties of the gap are more deterministic. Additionally, heating through a gaseous interface is advantageous because the heating element cannot impart any adverse stresses to the wafer holder which may cause wafer misalignment.

In a second non-exclusive embodiment, recesses are formed in the wafer clamp, directly exposing at least portions of the two wafers to the first pressure maintained in the chamber, while the second pressure is maintained between the two wafers. As a result, a pneumatic force is created by the pressure differential that acts directly on the two wafers. Heating elements are provided through the recesses formed in the wafer clamp. With this arrangement, the heating elements are provided adjacent to, but not in mechanical contact with, the back surfaces of the two wafers. As a result, a non-mechanical, gaseous interface, thermal path is defined directly between the heating elements and the wafers, resulting in greater efficiency.

The wafer bonding and clamping embodiments described above provide a number of advantages. First, the use of a pneumatic force minimizes or eliminates altogether the shear forces created by mechanical pistons or the like physically contacting the wafer clamp. Second, the non-mechanical thermal path, regardless of the embodiment used, provides substantially even and controlled heating, resulting in minimal differential thermal expansion between the two wafers. As a result of both of these advantages, misalignment between the wafers is substantially minimized Third, since the heating and pressurizing elements are decoupled from one another, each can be optimized for its specific task.

BRIEF DESCRIPTION OF THE DRAWINGS

The invention may best be understood by reference to the following description taken in conjunction with the accompanying drawings, which illustrate specific embodiments of the invention.

FIGS. 2A and 2B are cross-sectional diagrams of another non-exclusive embodiment of a wafer clamp and wafer bonding device in accordance with the principles of the present invention.

It should be noted that like reference numbers refer to like elements in the figures.

The above-listed figures are illustrative and are provided as merely examples of embodiments for implementing the various principles and features of the present invention. It should be understood that the features and principles of the present invention may be implemented in a variety of other embodiments and the specific embodiments as illustrated in the Figures should in no way be construed as limiting the scope of the invention.

DETAILED DESCRIPTION OF SPECIFIC EMBODIMENTS

The invention will now be described in detail with reference to various embodiments thereof as illustrated in the accompanying drawings. In the following description, specific details are set forth in order to provide a thorough understanding of the invention. It will be apparent, however, to one skilled in the art, that the invention may be practiced without using some of the implementation details set forth herein. It should also be understood that well known operations have not been described in detail in order to not unnecessarily obscure the invention.

Figure 1:
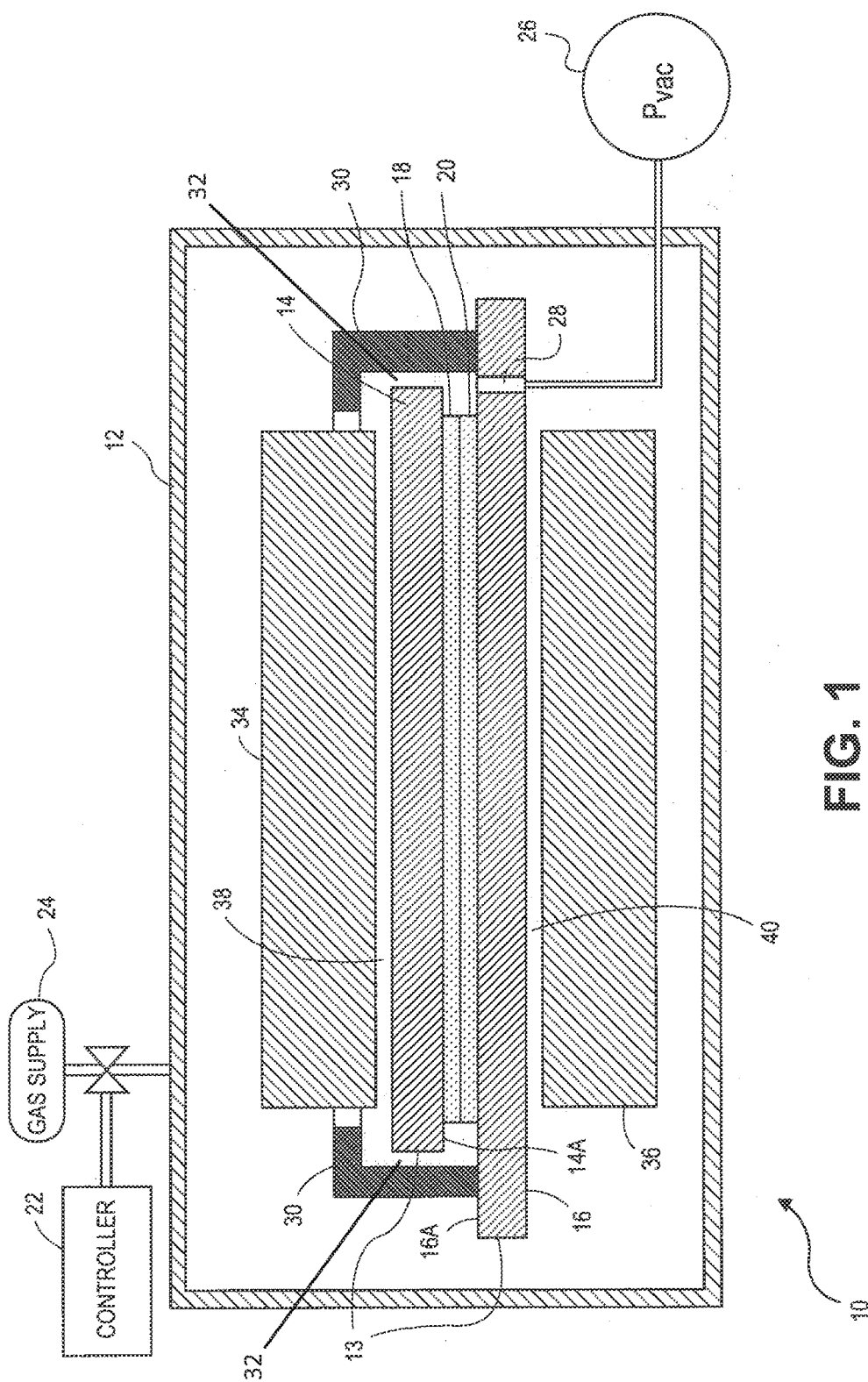
FIG. 1 is a cross-section of a non-exclusive embodiment of a wafer bonding device in accordance with the principles of the present invention.

Referring to FIG. 1, a cross-section of a non-exclusive embodiment of a wafer bonding device 10 in accordance with the principles of the present invention is shown. The wafer bonding device 10 includes a pressure chamber 12 and a wafer clamp 13 including a first wafer clamping element 14 defining a first clamping surface 14A and a second wafer clamping element 16 defining a second clamping surface 16B. The first and second clamping surfaces 14A, 16A are configured to contact and clamp two wafers 18, 20 together in alignment.

A controller 22 is configured to control the pressure within the pressure chamber 12. The controller 22 is coupled between the pressure chamber 12 and a gas supply 24 and is responsible for introducing or removing gas from the pressure chamber 12 as needed to maintain an ambient environment in the chamber 12 at a predetermined first pressure. When the clamp 13 is placed within the chamber 12, the first pressure surrounds the first and second wafer clamping elements 14, 16 and the two wafers 18, 20. In various embodiments, the pressure chamber 12 is a hyperbaric chamber. In further embodiments, the first pressure maintained within the chamber 12 ranges from 1 to 50 bars during bonding operations. The gas is also preferably inert to the bonding process of the wafers 18, 20. In various embodiments, suitable gasses include nitrogen, argon, carbon dioxide, neon, air, or any combination thereof.

A vacuum element ($P_{vac}$) 26 is fluidly coupled to the space between the first clamping surface 14A and the second clamping surface 16A of the wafer clamp 13 via a vacuum port 28 provided through the second wafer clamping element 16. When activated, the vacuum element 26 creates a second pressure (i) between the two wafers 18, 20 and (ii) in the embodiment shown, between the two clamping surfaces 14A and 14A of the wafer clamp 13. In various embodiments, the second pressure is adequately lower than the first pressure to obtain a pressure difference which achieves a wafer clamping force on the order of about 100 kN. For a 300 mm wafer, this translates to a pressure difference on the order of about 14 bars. In other embodiments, depending on the size of the wafers 18, 20 and other factors, the pressure difference can be either greater or smaller than 14 bars.

A seal 30 is mechanically coupled around the perimeter of the second clamping surface 16A of the second wafer clamping element 16. In a non-exclusive embodiment, a gap 32 is provided around the perimeter of the seal 30 and the first wafer clamping element 14. With the presence of the gap 32, the seal 30 defines a partial (i.e., a "leaky") seal between (a) the ambient first pressure maintained within the pressure chamber 12 and (b) the second pressure maintained between the two wafers 18, 20 and the two wafer clamping surfaces 14A and 16A. The seal 30 also prevents a mechanical path from existing between the first surface 14A and the second surface 16A of the wafer clamp 13, except through the two wafers 18, 20. This is important to ensure that the seal 30 remains seated on the surface 16A, regardless of thicknesses of the wafers 18, 20, which may vary. In an alternative embodiment (not illustrated), the seal 30 may periodically contact the perimeter of the first wafer clamping element 14, so long as the gap 32 is not eliminated and the seal 30 is not prevented from seating on the surface 16A.

With the above-defined arrangements, a pneumatic force is imparted on the first and second wafer clamping elements 14, 16 of the wafer clamp 13. The pneumatic force is created by the differential pressure between (i) the first pressure maintained in the pressure chamber 12 surrounding the wafer clamping elements 14, 16 of the wafer clamp 13 and (ii) the second pressure between the two wafers 18, 20 and wafer clamping surfaces 14 and 16A respectively. In other words, the pressure differential between the first pressure and the second creates non-contact, pneumatic, force acting on the first and second wafer clamping elements 14, 16, which in turn, impart a bonding force on the wafers 18, 20 respectively.

First and second heating elements 34, 36 are provided adjacent to, but not in mechanical contact with, the first and the second wafer clamping elements 14, 16 respectively. As a result, non-mechanical thermal paths are defined by the gaseous interface present in gaps 38, 40, provided between the two heating elements 34, 36 and the wafer clamping elements 14, 16 respectfully. Heating through the gaseous interface is advantageous because the conductance uniformity along the interface is not significantly influenced by surface flatness, surface roughness, and other stresses at the contact surface between the clamp and the heating elements. Therefore, the thermal conductivity properties of the gaps 38, 40 are more deterministic (i.e., easy to predict). In addition, heating through a gaseous interface, as opposed to direct mechanical contact, prevents the heating elements 34, 36 from imparting adverse stresses on the wafer clamping elements 14, 16, which may cause wafer misalignment.

FIG. 2A is a cross-sectional diagram of another wafer clamp 50 for use in cooperation with bonding device 10. The wafer clamp 50 includes a first wafer clamping element 52 defining first wafer clamping surface 54 which includes an outer porous region 56 and an inner porous region 58. The wafer clamp 50 also includes a second wafer clamping element 60 that is "cup-shaped" and includes a second wafer clamping surface 62 located at the bottom of the cup. The second wafer clamping surface 62 includes an outer porous region 64 and an inner porous region 66. The porous regions 56, 58 of the first wafer clamping element 52 and the porous regions 64, 66 of the second wafer clamping element 60 are each selectively fluidly coupled to a second vacuum source $P_{2vac}$ through valves 69 respectively.

During clamping operation, a first wafer 18 is positioned adjacent to the first wafer clamping surface 54 of the first wafer clamping element 52 and a second wafer 20 is positioned adjacent the second wafer clamping surface 62 of the second wafer clamping element 60. The vacuum $P_{2vac}$ is applied to each of the porous regions 56, 58 and 64, 66, holding the first wafer 18 and the second wafer 20 in place with respect to surfaces 54, 62 respectively. The first wafer clamping element 52 and wafer 18 are then positioned within the cup-shaped recess of the second wafer clamping element 60. A gap 32 is provided between the outer periphery of the first wafer clamping element 52 and the inner wall of the cup-shaped recess of the second wafer clamping element 60.

Referring to FIG. 2B, the clamp 50 is shown in bonding device 10. During bonding operation, the controller 22 controls the amount of gas to achieve the desired first pressure in chamber 12, surrounding the wafer clamping elements 52, 60 of the wafer clamp 50. Vacuum element 26 ($P_{vac}$) is then activated, creating a vacuum between the wafers 18, 20 and between the first wafer clamping surface 54 and the second wafer clamping surface 62. As a result, a pressure differential is created via the at least a partial seal defined by gap 32 between the first pressure in the chamber 12 and the vacuum between the wafers 18, 20 and between the surfaces 54, 62. A non-contact, pneumatic, force is thus created and applied to the first and second wafer clamping elements 52, 60, which in turn, impart a bonding force on the wafers 18, 20 respectively. The vacuum $P_{2vac}$ (not illustrated) may also be selectively applied to the porous regions 54, 56, 62, 64 during bonding.

In addition, the first and second heating elements 34, 36 are provided adjacent to, but not in mechanical contact with, the first and the second wafer clamping elements 52, 60 respectively. As a result, non-mechanical thermal paths are defined by the gaseous interface present in gaps 38, 40, provided between the two heating elements 34, 36 and the wafer clamping elements 52, 60 respectfully.

Figure 3A:
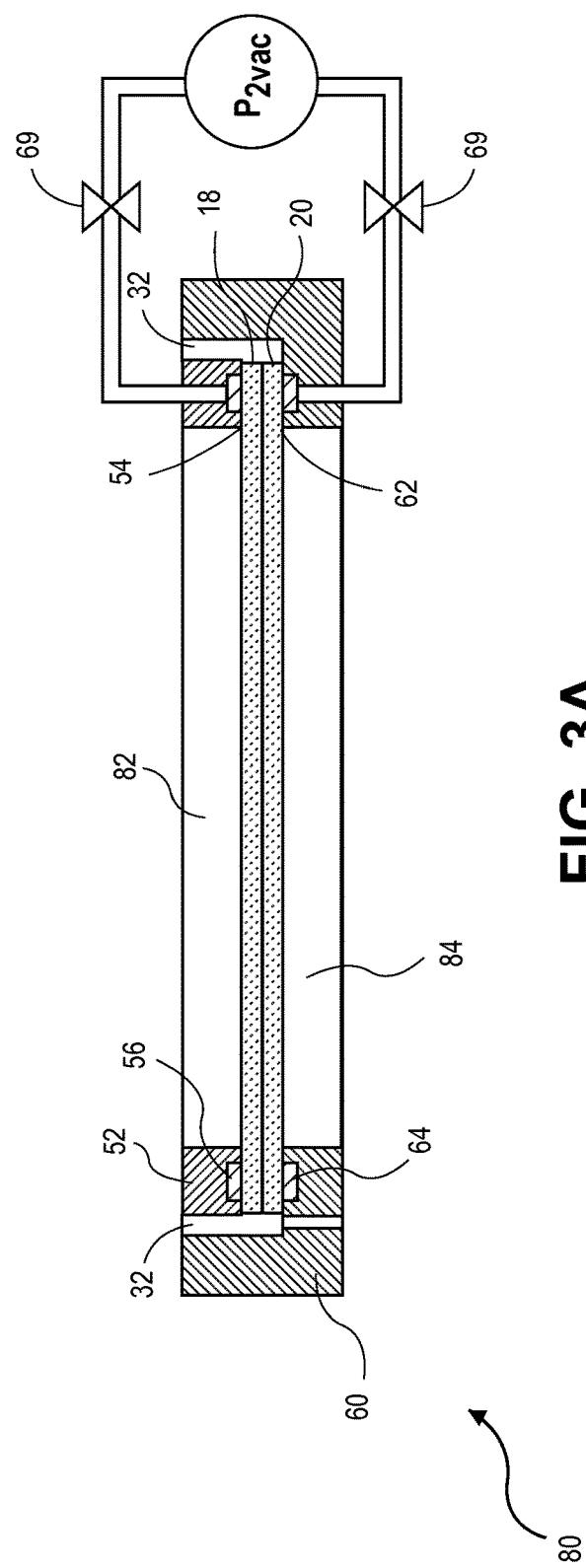
FIGS. 3A and 3B are cross-section diagrams of yet another non-exclusive embodiment of a wafer clamp and wafer bonding device in accordance with the principles of the present invention.

Referring to FIG. 3A, another wafer clamp 80 is illustrated. The wafer clamp 80 is similar to the clamp 50, except the wafer clamping elements 52, 60 include recesses 82 and 84 instead of the inner porous regions 58, 66 respectively. As a result, the center, back surfaces, of wafers 18, 20 each are exposed to the surrounding ambient environment maintained at the first pressure within the chamber 12 during bonding, as described below.

Figure 3B:
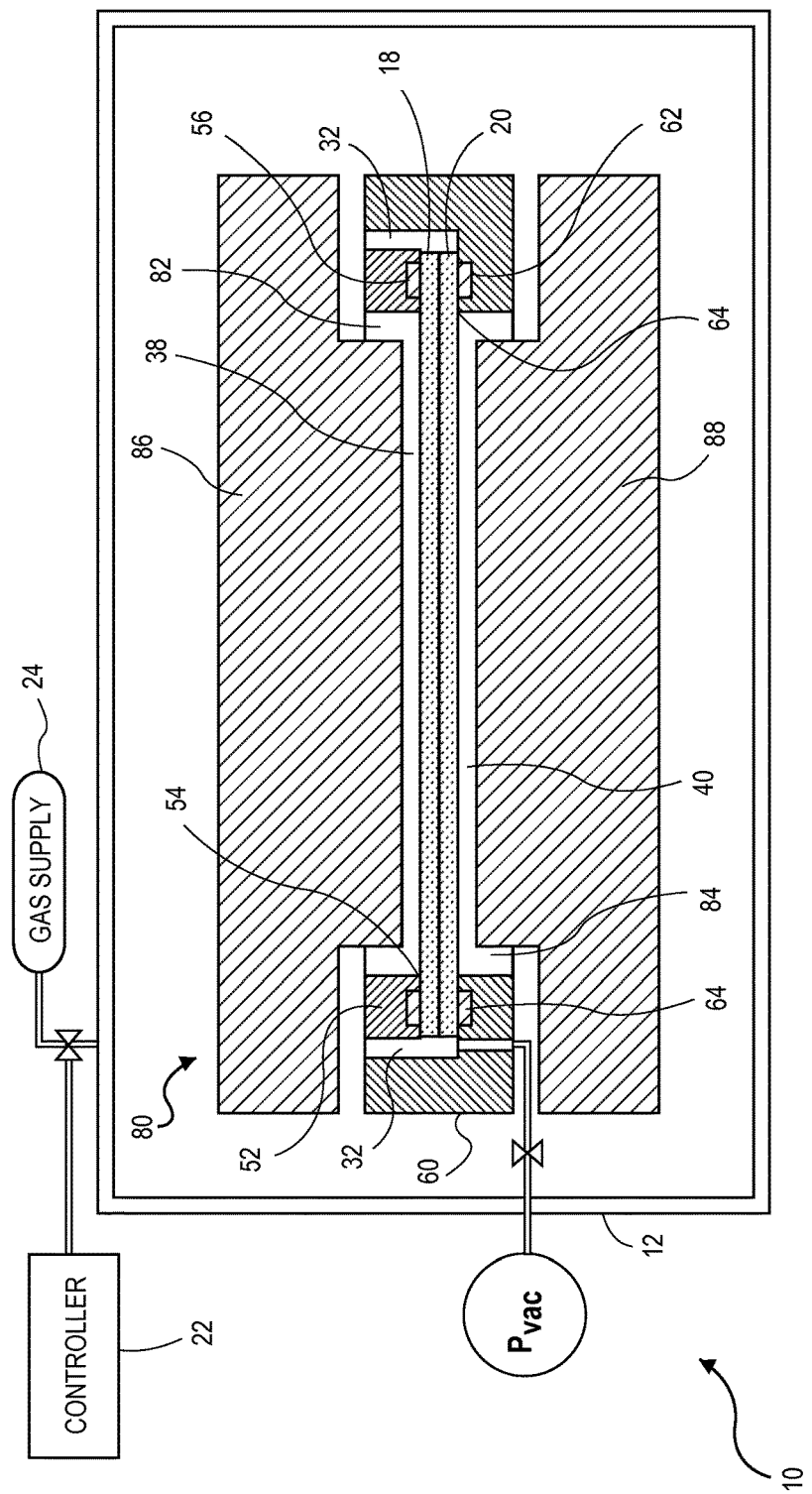

Referring to FIG. 3B, the clamp 80 is shown in bonding device 10. During bonding operation, the controller 22 controls the amount of gas to achieve the desired first pressure in chamber 12. As a result, the wafer clamping elements 52, 60 and the back surfaces of the wafers 18, 20 are exposed to the surrounding ambient environment within chamber 12 maintained at the first pressure. Vacuum element 26 ($P_{vac}$) is then activated, creating a vacuum between the wafers 18, 20 and between the first wafer clamping surface 54 and the second wafer clamping surface 62. As a result, a pressure differential is created via the at least a partial seal defined by gap 32 between the first pressure in the chamber 12 and the vacuum between the wafers 18, 20. A non-contact, pneumatic, force is thus created directly on the back surfaces of the two wafers 18, 20, which is used to bond the two wafers together.

In addition, heating elements 86, 88 provided through the recess regions 82, 84 during bonding respectively. As a result, non-mechanical thermal paths are defined by the gaseous interface present in gaps 38, 40, provided directly between the two heating elements 86, 88 and the wafers 18, 20 respectfully. With this arrangement, the wafers 18, 20 are not heated through the wafer clamping elements 52, 60, resulting in improved thermal efficiency.

In variations of the FIG. 3A-3B embodiment, the recess regions 82, 84 need not be one large recess, but rather, can be divided into two or more smaller recesses. In such embodiments, one or more smaller heating elements 86, 88, each provided through the smaller recesses, is used. In addition, the vacuum $P_{2vac}$ (not illustrated) may be selectively applied to the outer porous regions 56, 64 during bonding.

In various additional embodiments, the gaps 38, 40 as described above with regard to FIGS. 1, 2A-2B, and 3A-3B may range from 10 to 200 microns. In other embodiments, the gaps 38, 40 may be less than 10 microns or more than 200 microns.

In yet various other embodiments of FIGS. 1, 2A-2B, and 3A-3B, the first and second heating elements 34/86, 36/88 is/are resistive heating elements, infrared heating elements, or a combination of both. Depending on the type of heating elements used, the heat transfer across the gaps 38, 40 for heating the wafer clamping elements 14/52, 16/60 or the wafers 18,20 may occur via (i) conductive heating, (ii) radiant heating, (iii) convective heating, or any combination of (i) through (iii). In further embodiments, the heating elements 34/86, 36/88 and/or the wafer clamping elements 14/52, 16/60 may also be configured to apply even heating across the bonding surfaces of the two wafers 18, 20, or alternatively, heating of targeted, complementary, locations on the bonding surfaces of the two wafers 18, 20 respectively. Furthermore, the reduction of a mechanical contact between the heating elements 34/36, 86/88 and wafer clamping elements 14/16, 52/60 and/or wafers 18, 20 reduces the likelihood of misalignment due to differential thermal expansion.

In variations of the embodiments of FIGS. 1, 2A-2B, and 3A-3B, the non-contact, pneumatic, force created by the pressure differential between the first pressure and the second pressure alone is used for wafer bonding. In alternative embodiments, however, a contact force may be used in cooperation with the non-contact, pneumatic, force created by the pressure differential. For example, other devices that impart a mechanical force, such as springs and/or pistons, may be used to exert a contact force on the first and second wafer clamping elements 14/16, 52/60 or directly on the back surfaces of the wafers 18, 20. Consequently, within the context of the present application, the bonding of wafers 18, 20 using a non-contact, pneumatic, force as described herein does not necessarily exclude the use of one or more contact force elements.

Figure 4:
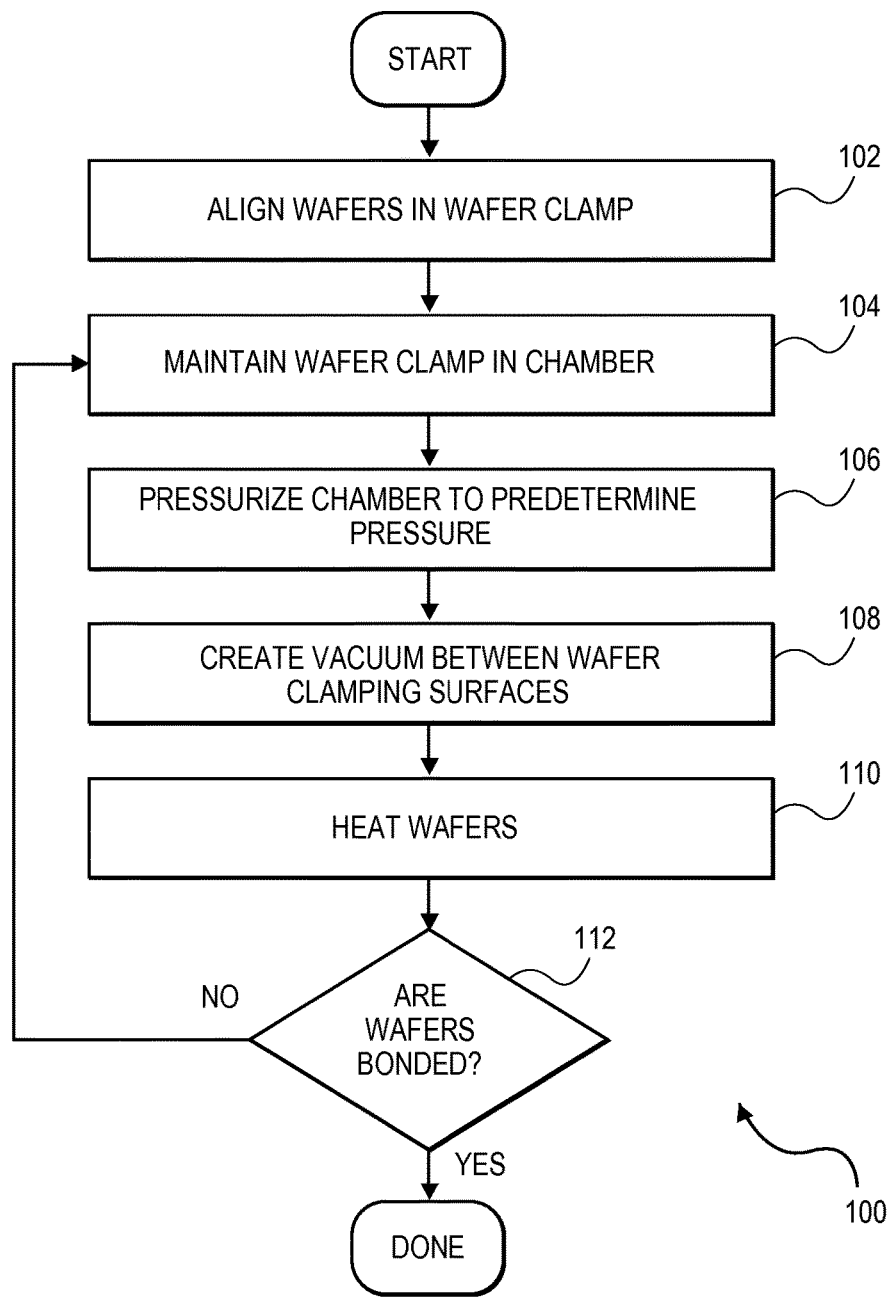
FIG. 4 illustrates a flow chart for bonding wafers in accordance with the principles of the present invention.

Referring to FIG. 4, a flow chart 100 for bonding wafers 18, 20 in accordance each of the wafer bonding embodiments described above. During operation, the two wafers 18, 20 to be bonded are first aligned with respect to one another. In various embodiments, the alignment may take place at a remote alignment station or in situ to bonding device 10. Regardless of where the alignment takes place, the aligned wafers 18, 20 are positioned between the wafer clamping surfaces 14A/54, 16A/62 of wafer clamping elements 14/16 and 52/60 respectively (step 102). Thereafter, the wafer clamp 13/50/80 is placed or otherwise maintained in the chamber 12 of the bonding device 10 (step 104). Next, the controller 22 adjusts the amount of gas as needed to pressurize the chamber 12 to the predetermined first pressure (step 106). In addition, the vacuum element 26 ($P_{vac}$) is activated, creating the second pressure between the wafers 18/20 and wafer clamping surfaces 14A/16A, 54/62 (step 108). The pressure differential between (i) the vacuum between the wafers 18/20 and wafer clamping surfaces 14A/16A, 54/62 and (ii) the pressure within the chamber 12 creates the pneumatic force that acts either on the wafer clamping elements 14/16, 52/60 of the FIGS. 1 and 2A-2B embodiments or directly on the wafers 18, 20 of the FIG. 3A-3B embodiment. In addition, the heating elements 34/36, 86/88 heat the wafers 18/20 either via wafer clamping elements 14A/16A, 54/62 or directly as provided in the FIG. 3A-3B embodiment. Regardless of the embodiment, a non-mechanical heating path defined by the gaseous interface within the gaps 38, 40 is used to heat the wafers by conductive, radiant and/or convective heating. In decision 112, it is determined if the wafers are bonded or not. If not, the steps 104-110 are continually performed until sufficient bonding force and/or heat is applied, result in wafer bonding. When bonding is complete, the process is terminated and may be repeated for an additional pair of wafers.

In various embodiments, determining when the bonding is complete in step 112 may be ascertained by such factors as the time duration the pressure and heat are applied to the wafers, the magnitude of the pressure, the amount of heat applied to the wafers, composition or materials of the wafers 18, 20 to be bonded, the use of in situ monitors, or any combinations thereof.

In various embodiments, the wafers 18, 20 may be heated from 150 to 600 C degrees during bonding operation. In addition, the pneumatic force applied on the wafers 18, 20 by the differential pressure may range from 10 kN to 100 kN. Furthermore, the time period for applying the bonding force and temperature to the wafers 18, 20 may range from 0.5 to 100 minutes.

The wafer bonding and clamping embodiments described above provide a number of advantages. First, the use of a pneumatic force minimizes or eliminates altogether the shear forces created by mechanical pistons or the like physically contacting the wafer clamps 13/50/80. Second, the non-mechanical thermal path, regardless of the embodiment used, provides substantially even and controlled heating, resulting in minimal differential thermal expansion between the two wafers 18, 20. As a result of both of these advantages, misalignment between the wafers 18, 20 is substantially minimized Third, since the heating and pressurizing elements are decoupled from one another, each can be optimized for its specific task. In various embodiments, the heating pattern can be substantially uniform, or alternatively, they can be used to create complimentary targeted heated locations on the surfaces of the wafers respectively. In various other embodiments, the heating elements 34/36, 86/88 can be an exposed patterned metal conductor on a ceramic substrate. Because the heating elements are not in a clamping load path, the conductor can be exposed to the gaseous interface provided in the gaps 38, 40. As a result, there is no need to encapsulate the heating elements, resulting in greater thermal efficiency.

The present application also incorporates commonly assigned, co-pending provisional patent application entitled System and Method for Clamping Wafers Together in Alignment Using Pressure, filed on the same day as the present application, by Alton Phillips and Fardad Hashemi.

Although many of the components and processes are described above in the singular for convenience, it will be appreciated by one of skill in the art that multiple components and repeated processes can also be used to practice the techniques of the system and method described herein. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the invention may be employed with a variety of components and should not be restricted to the ones mentioned above. It is therefore intended that the invention be interpreted to include all variations and equivalents that fall within the true spirit and scope of the invention.

What is claimed is:

1. A wafer bonding apparatus for holding and bonding a first wafer to a second wafer in alignment; the wafer bonding apparatus comprising:
a wafer clamp for holding the first wafer and the second wafer together in alignment, the wafer clamp including a first wafer clamping element that is configured to selectively retain the first wafer, and a second wafer clamping element that is configured to selectively, retain the second water;
a first heating element configured to heat the first wafer to a bonding temperature, the first heating element being positioned adjacent to, but not in mechanical contact with, the first water clamping element; and
a second heating element configured to heat the second wafer to the bonding temperature, the second heating element being positioned adjacent to, but not in mechanical contact with, the second wafer clamping element;
a chamber that encircles the first wafer clamping element, the second wafer clamping element, the first heating element and the second heating element;
a controller that maintains an ambient environment in the chamber at a first pressure; and
a pneumatic force generator configured to generate a pneumatic force used to bond the first wafer and the second water heated to the bonding temperature, the pneumatic force generated by creating a pressure differential between the ambient environment within the chamber maintained at the first pressure while maintaining a second pressure between the first wafer and the second wafer held together in alignment by the clamp, wherein the first pressure is greater than the second pressure.

2. The wafer bonding apparatus of claim 1, wherein the wafer clamp clamps at a periphery of the first wafer and the second wafer, while maintaining a first center region of the first wafer and a second center region of the second wafer exposed to the ambient environment maintained at the first pressure.

3. The wafer bonding apparatus of claim 2, wherein the first heating element is positioned adjacent to, but not in mechanical contact with, the first center region of the first wafer and the second heating element is positioned adjacent to, but not in mechanical contact with, the second center region of the second wafer.

4. The wafer bonding apparatus of claim 1, wherein the pneumatic force generated by the pneumatic force generator acts on the first wafer clamping element and the second wafer clamping element, which in turn, applies a bonding force on the first wafer and the second wafer respectively.

5. The wafer bonding apparatus of claim 1, wherein the heating elements are further configured to heat the first wafer and the second wafer via one or more gaseous interfaces.

6. The wafer bonding apparatus of claim 1, wherein the heating elements are further configured to heat the first wafer and the second wafer using conductive heating.

7. The wafer bonding apparatus of claim 1, wherein the heating elements are further configured to minimize differential thermal expansion between the first wafer and the second wafer during bonding.

8. The wafer bonding apparatus of claim 1, wherein the heating elements are further configured to provide substantially even heating across the first wafer and the second wafer during bonding.

9. The wafer bonding apparatus of claim 1, wherein the heating elements are further configured to provide targeted heating of complementary locations across the first wafer and the second wafer during bonding.

10. The wafer bonding apparatus of claim 1, wherein the wafer clamp further comprises a first wafer clamping surface and a second wafer clamping surface for contacting the first wafer and the second wafer respectively.

11. The wafer bonding apparatus of claim 10, wherein the first wafer clamping surface includes one or more porous regions.

12. The wafer bonding apparatus of claim 1, further comprising a vacuum element fluidly coupled between the first wafer and the second wafer when held together by the wafer clamp and configured to maintain the second pressure between the first wafer and the second wafer.

13. The wafer bonding apparatus of claim 1, further comprising a seal provided between the first pressure maintained within the chamber and the second pressure maintained between the first wafer and the second wafer.

14. The wafer bonding apparatus of claim 13, wherein the seal provides a gas flow path between the ambient environment within the chamber and a region between the first wafer and the second wafer to allow at least some flow of gas from the ambient environment within the chamber to the region between the first wafer and the second wafer.

15. The wafer bonding apparatus of claim 1, wherein the pressure differential ranges from 1 to 50 bars.

16. The wafer bonding apparatus of claim 1, further comprising a mechanical force generator configured to generate a mechanical force in addition to the pneumatic force for bonding the wafers.

17. The wafer bonding apparatus of claim 1, wherein the pneumatic force ranges from 10 kN to 100 kN during bonding.

18. The wafer bonding apparatus of claim 1, wherein the first wafer and the second wafer are heated to a temperature ranging from 150 C to 700 C during bonding.

19. The wafer bonding apparatus of claim 1, wherein the chamber is a hyperbaric chamber.

20. The wafer bonding apparatus of claim 1, wherein the first pressure in the chamber ranges from 1 to 50 bars.

21. The wafer bonding apparatus of claim 1, wherein the controller is configured to maintain the first pressure within the chamber by controlling the amount of gas in the chamber.

22. The wafer bonding apparatus of claim 21, wherein the gas is inert to the process of bonding the two wafers.

23. The wafer bonding apparatus of claim 22, wherein the gas comprises nitrogen, argon, carbon dioxide, neon, air, or any combination thereof.

24. A method comprising (i) providing a first wafer, (ii) providing a second wafer, and (iii) bonding the first wafer to the second wafer with the wafer bonding apparatus of claim 1.

25. A wafer bonding apparatus for holding and bonding a first wafer to a second wafer in alignment, the first wafer and the second wafer each including a front surface that are configured to face one another during a wafer bonding procedure, and a back surface that are configured to face away from one another during the wafer bonding procedure, the wafer bonding apparatus comprising:
   a chamber;
   a controller that maintains an ambient environment in the chamber at a first pressure;
   a first wafer clamping element that is configured to selectively retain the first wafer, the first wafer clamping element being positioned in the chamber and configured such that the back surface of the first wafer is exposed to the ambient environment maintained at the first pressure;
   a second wafer clamping element that is configured to selectively retain the second wafer, the second wafer clamping element being positioned in the chamber;
   a first heating element that is configured to heat the back side of the first wafer to a bonding temperature during the wafer bonding procedure; and
   a pneumatic force generator that is configured to generate a pneumatic force directly on the back surface of the first wafer and the back surface of the second wafer, the pneumatic force being used to bond the first wafer and the second wafer, the pneumatic force being generated by creating a pressure differential between the ambient environment maintained at the first pressure while creating a second pressure between the first wafer and the second wafer, the second pressure being lower than the first pressure.

26. The wafer bonding apparatus of claim 25 wherein the second wafer clamping element is configured such that the back surface of the second wafer is exposed to the ambient environment at the first pressure.

27. The wafer bonding apparatus of claim 26 further comprising a second heating element that is configured to heat the second wafer to the bonding temperature during the wafer bonding procedure.

28. The wafer bonding apparatus of claim 25 wherein the first heating element is positioned adjacent to, but not in contact with, the first wafer clamping element.

29. The wafer bonding apparatus of claim 25 wherein the first heating element is positioned adjacent to, but not in contact with, the first wafer.

30. The wafer bonding apparatus of claim 25 wherein the pneumatic force generator includes a vacuum element that creates the second pressure between the first wafer and the second wafer.

31. The wafer bonding apparatus of claim 25 wherein the first heating element is configured to heat the first wafer via one or more gaseous interfaces.

32. The wafer bonding apparatus of claim 25 wherein the first wafer clamping element includes a first recess and the second wafer clamping element includes a second recess such that the first wafer clamping element and the second wafer clamping element are substantially annular-shaped.

33. The wafer bonding apparatus of claim 25 further comprising a seal provided between ambient environment maintained at the first pressure and the second pressure created in a region between the first wafer and the second wafer.

34. The wafer bonding apparatus of claim 33 wherein the seal provides a gas flow path between the ambient environment and the region between the first wafer and the second wafer to allow at least some flow of gas from the ambient environment to the region between the first wafer and the second wafer.

* * * * *

UNITED STATES PATENT AND TRADEMARK OFFICE
CERTIFICATE OF CORRECTION

PATENT NO. : 10,121,760 B2
APPLICATION NO. : 14/519831
DATED : November 6, 2018
INVENTOR(S) : Alton H. Phillips Page 1 of 1

It is certified that error appears in the above-identified patent and that said Letters Patent is hereby corrected as shown below:

In the Claims

Column 8, Line 19, replace ";" with --,--

Column 8, Line 25, delete ","

Column 8, Line 26, replace "water" with --wafer--

Column 8, Line 30, replace "water" with --wafer--

Column 8, Line 30, delete "and,"

Column 8, Line 43, replace "water" with --wafer--

Signed and Sealed this
Ninth Day of April, 2019

Andrei Iancu
*Director of the United States Patent and Trademark Office*